United States Patent
Randhawa et al.

(10) Patent No.: US 9,762,265 B2
(45) Date of Patent: *Sep. 12, 2017

(54) METHODS AND SYSTEMS FOR ENHANCED DETECTION OF ELECTRONIC TRACKING MESSAGES

(71) Applicant: exactEarth Ltd., Cambridge (CA)

(72) Inventors: Baljinder S. Randhawa, Kitchener (CA); Arunas G. Maciknuas, Cambridge (CA); Margaret J. Browning, Bradenton, FL (US); Philip L. Miller, Cambridge (CA); Christopher M. Short, Cambridge (CA)

(73) Assignee: EXACTEARTH LTD., Cambridge (CA)

( * ) Notice: Subject to any disclaimer, the term of this patent is extended or adjusted under 35 U.S.C. 154(b) by 52 days.

This patent is subject to a terminal disclaimer.

(21) Appl. No.: 14/802,373

(22) Filed: Jul. 17, 2015

(65) Prior Publication Data

US 2015/0326350 A1 Nov. 12, 2015

Related U.S. Application Data

(63) Continuation-in-part of application No. 14/524,210, filed on Oct. 27, 2014, now Pat. No. 9,094,048, which
(Continued)

(51) Int. Cl.
*H03M 13/00* (2006.01)
*G01S 5/00* (2006.01)
(Continued)

(52) U.S. Cl.
CPC .......... *H03M 13/63* (2013.01); *G01S 5/0027* (2013.01); *G01S 19/16* (2013.01);
(Continued)

(58) Field of Classification Search
CPC ..... H04L 1/004; H04L 1/0061; H04L 1/0078; H04L 1/1004; H04L 1/0083; H03M 13/63;
(Continued)

(56) References Cited

U.S. PATENT DOCUMENTS 3,986,693 A 10/1976 Johnson
4,438,421 A 3/1984 Leach, Jr.
(Continued)

FOREIGN PATENT DOCUMENTS

EP 2651046 A2 10/2013
WO WO9854866 A2 12/1998

OTHER PUBLICATIONS

Extended European Search Report for corresponding European Patent Application No. 14760801.2 dated Oct. 4, 2016.
(Continued)

*Primary Examiner* — Shelly A Chase
(74) *Attorney, Agent, or Firm* — Caesar Rivise, PC

(57) ABSTRACT

Methods and systems for enhancing the detectability of electronic tracking messages are provided. Transmitters apply error protection encoding to the payload portion of messages to be transmitted. Transmitted messages are received by a satellite or other surveillance platform employing a compatible radio frequency receiver to collect message signals over a large area or great distance. Candidate messages are identified and the error protection encoding decoded to recover messages.

23 Claims, 9 Drawing Sheets

Related U.S. Application Data is a continuation of application No. 13/786,059, filed on Mar. 5, 2013, now Pat. No. 8,904,257.

(51) Int. Cl.
  *H04L 1/00* (2006.01)
  *H04L 12/46* (2006.01)
  *H03M 13/29* (2006.01)
  *G01S 19/16* (2010.01)
  *H03M 13/11* (2006.01)
  *H03M 13/15* (2006.01)
  *G01S 5/02* (2010.01)

(52) U.S. Cl.
  CPC ...... *H03M 13/2933* (2013.01); *H04L 1/0041* (2013.01); *H04L 1/0045* (2013.01); *H04L 1/0057* (2013.01); *H04L 1/0059* (2013.01); *H04L 1/0065* (2013.01); *H04L 1/0078* (2013.01); *H04L 1/0083* (2013.01); *H04L 12/4633* (2013.01); *G01S 5/0226* (2013.01); *H03M 13/1102* (2013.01); *H03M 13/152* (2013.01); *H03M 13/1515* (2013.01)

(58) Field of Classification Search
  CPC ............ H03M 13/2933; H03M 13/152; G01S 5/0027; G01S 19/38; G01S 19/16
  See application file for complete search history.

(56) References Cited

U.S. PATENT DOCUMENTS

| | | | |
|---|---|---|---|
| 4,677,403 A | 6/1987 | Kich | |
| 5,390,891 A | 2/1995 | Hornung et al. | |
| 5,428,323 A | 6/1995 | Geissler et al. | |
| 6,002,310 A | 12/1999 | Kich et al. | |
| 6,695,296 B1 | 2/2004 | Runge | |
| 6,913,791 B2 | 7/2005 | Burca et al. | |
| 7,546,395 B2 * | 6/2009 | Yamamoto | G01S 19/09 342/357.27 |
| 8,780,788 B2 | 7/2014 | Peach et al. | |
| 2008/0284647 A1 | 11/2008 | Oren et al. | |
| 2009/0161797 A1 | 6/2009 | Cowles et al. | |

OTHER PUBLICATIONS

"e-Navigation", Proceedings of the 17th Conference of the International Association of Marine Aids to Navigation and Lighthouse Authorities, (IALA-AISM), Cape Town, South Africa, Mar. 22-27, 2010, 90 pages.

"Nav 54/25", Sub-Committee on Safety of Navigation, 54th Session, Agenda Item 25, International Maritime Organization (IMO), Aug. 14, 2008, 146 pages.

Fiorini, Michele, "The Maritime e-Navigation and the Titanic: Are There Any Links?", 2011, IEEE, pp. 534-539.

Prevost, et al., "Interference Mitigation and Error Correction Method for AIS Signals Received by Satellite", 2012, IEEE, pp. 46-50.

International Search Report for related PCT Application No. PCT/CA2014/000166, dated May 26, 2014.

Stansell, et al., Future Wave L1C Signal Performance and Receiver Design, GPS World, www.gpsworld.com, vol. 22, No. 4, Apr. 2011, pp. 30-35, 41.

* cited by examiner

METHODS AND SYSTEMS FOR ENHANCED DETECTION OF ELECTRONIC TRACKING MESSAGES

CROSS-REFERENCE TO RELATED APPLICATIONS

This application is a continuation-in-part of U.S. patent application Ser. No. 14/524,210, filed Oct. 27, 2014, which is a continuation of U.S. patent application Ser. No. 13/786,059, filed Mar. 5, 2013, now issued as U.S. Pat. No. 8,904,257. The entirety of U.S. patent application Ser. Nos. 13/786,059 and 14/524,210 is hereby incorporated by reference.

FIELD

The described embodiments relate to electronic messaging and, more particularly, to methods and systems for enhancing the detectability of electronic messages transmitted via radio frequencies.

INTRODUCTION

Electronic messaging systems are employed in many different industries and businesses to communicate data for a variety of purposes. One class of electronic messaging systems is electronic tracking systems, used to detect or observe the locations of objects or persons.

Radiofrequency electronic messaging or tracking systems may operate at a wide variety of transmission ranges, depending on the power of the transmitter, channel conditions and the type of receiver. For instance, some electronic tracking systems may employ a battery-powered transmitter or transceiver affixed to the object being tracked, which can transmit a message over relatively large distances of several miles or even dozens of miles. A subset of electronic tracking systems may even provide tracked objects with global navigation service system receivers (e.g., Global Positioning System, Galileo or GLONASS), which may further augment the ability of an electronic tracking system to determine the precise location of the object.

SUMMARY

In one broad aspect, there is provided a method of generating an electronic tracking message with enhanced detectability, the method comprising: generating a binary payload; error protection encoding the binary payload; and encapsulating the binary payload in a message wrapper to produce the electronic tracking message. In some cases, the electronic tracking message may be an e-Navigation message.

In some cases, the error protection encoding comprises encoding the binary payload using forward error correction, block coding the binary payload, convolutional coding the binary payload, interleaving the binary payload, or any combination thereof. In some embodiments, the error protection encoding may comprise repetition coding.

In some cases, an error protection scheme used in the error protection encoding is selected from one or more of the group consisting of Low Density Parity Check coding, Turbo coding, Bose-Chaudhuri-Hocquenghem coding, and Reed-Solomon coding.

In some cases, the error protection encoding comprises joint coding and modulation.

In some cases, the message wrapper and the binary payload form one or more standards-compliant Automatic Identification System (AIS) messages.

In some cases, each of the one or more standards-compliant AIS messages has a variable length.

In another broad aspect, there is provided a method of recovering message data from an electronic tracking signal, wherein the message data is encoded with error protection encoding, the method comprising: receiving input signal data, the input signal data having been produced by demodulating and decoding the electronic tracking signal; identifying a candidate message in the input signal data; extracting a binary payload from the candidate message, the binary payload comprising at least one error protection encoding; and decoding the at least one error protection encoding of the binary payload to recover the message data.

In some cases, the candidate message contains one or more bit errors.

In some cases, the at least one error protection is forward error correction.

In some cases, the at least one error protection comprises interleaving, and the decoding comprises de-interleaving the binary payload.

In some cases, the at least one error protection comprises convolutional coding, and the decoding comprises Viterbi decoding.

In some cases, the at least one error protection comprises block coding, and the decoding comprises block decoding.

In some cases, the at least one error protection is selected from one or more of the group consisting of Low Density Parity Check coding, Turbo coding, Bose-Chaudhuri-Hocquenghem coding, and Reed-Solomon coding.

In some cases, the candidate message is identified by correlating at least a portion of the candidate message to a predetermined sequence.

In some cases, the predetermined sequence is selected from one or more of the group consisting of an AIS training sequence, an AIS start flag, and an AIS end flag. In some cases, the predetermined sequence may comprise other fields or sequences of the AIS message.

In some cases, the binary payload is extracted using a predetermined bit offset within the candidate message.

In some cases, the candidate message is one or more standards-compliant AIS messages.

In some cases, each of the one or more standards-compliant AIS messages has a variable length.

In another broad aspect, there is provided a transponder for generating and transmitting an electronic tracking signal comprising an e-Navigation message with enhanced detectability, the transponder comprising: a message data module configured to receive message data to be transmitted, and generate a binary payload based on the message data; an error protection module configured to encode the binary payload using at least one error protection scheme; and a message formatting module configured to encapsulate the binary payload in a message wrapper of the electronic tracking message.

In another broad aspect, there is provided a receiver for recovering message data from an electronic tracking signal, wherein the e-Navigation signal comprises an electronic tracking message with enhanced detectability, the receiver comprising: a message processing module configured to identify a candidate message in input signal data, the input signal data having been produced by demodulating and decoding the electronic tracking signal; a payload processing module configured to: extract a binary payload from the candidate message, the binary payload having at least one error protection scheme; and decode the at least one error protection encoding scheme of the binary payload to recover the message data.

In another broad aspect, there is provided an electronic tracking messaging system comprising: a transponder for generating and transmitting an electronic tracking signal comprising an electronic tracking message with enhanced detectability, the transponder comprising: a message data module configured to receive message data to be transmitted, and generate a binary payload based on the message data; an error protection module configured to encode the binary payload using at least one error protection scheme; and a message formatting module configured to encapsulate the binary payload in a message wrapper of the electronic tracking message; and a receiver for recovering the message data from the electronic tracking signal, the receiver comprising: a message processing module configured to identify a candidate message in input signal data, the input signal data having been produced by demodulating and decoding the electronic tracking signal; a payload processing module configured to: extract the binary payload from the candidate message, the binary payload having the at least one error protection scheme; and decode the at least one error protection encoding scheme of the binary payload to recover the message data.

DRAWINGS

For a better understanding of the various embodiments described herein, and to show more clearly how they may be carried into effect, reference will now be made, by way of example only, to the accompanying drawings in which.

DESCRIPTION OF VARIOUS EMBODIMENTS

Figure 1A:
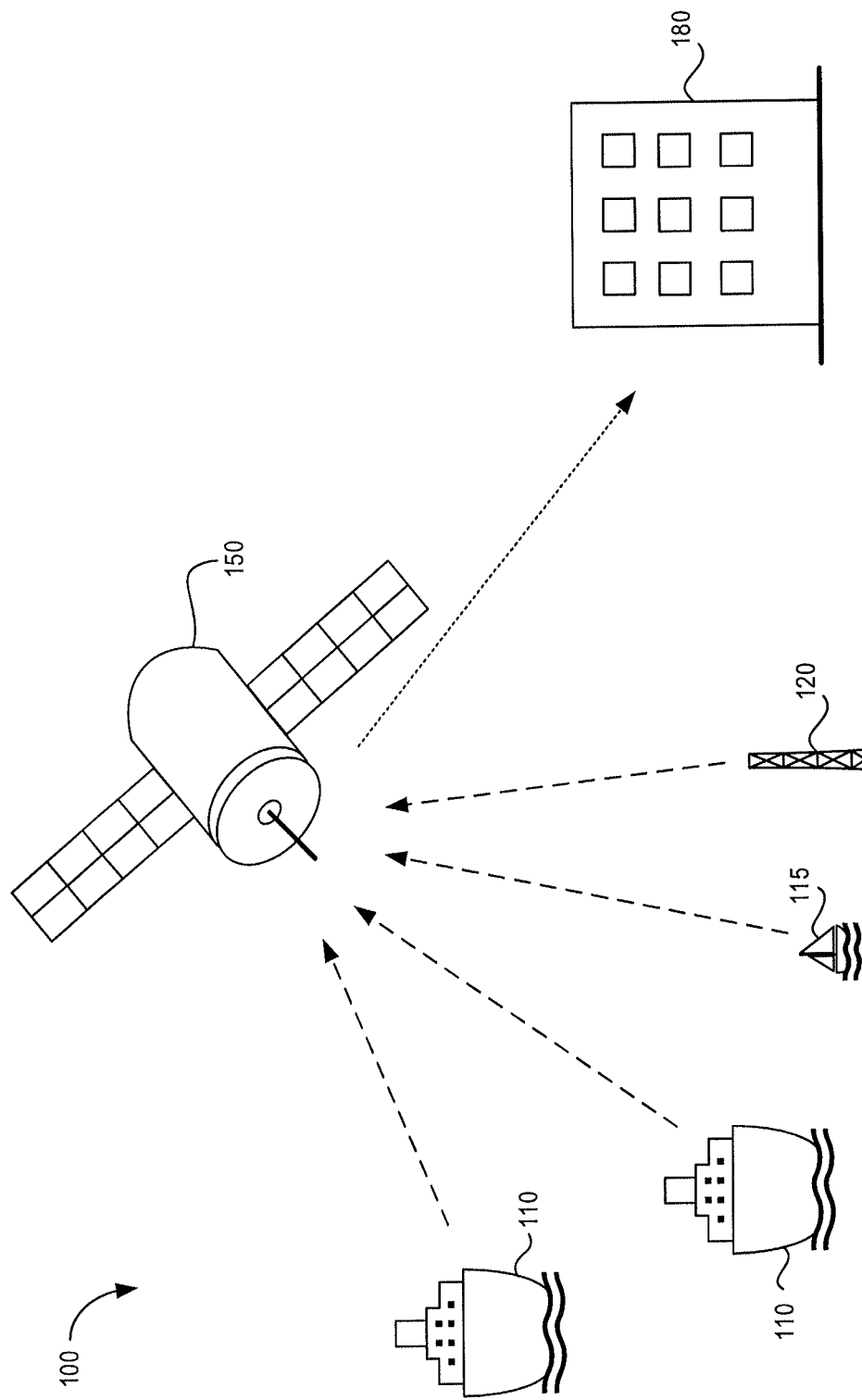
FIG. 1A is a simplified schematic diagram of an example electronic tracking system.

The reliability of electronic messaging systems can depend on many factors: transmitter power, data rate, channel conditions (e.g., noise, interference, etc.) and receiver type, for example. In low power applications, noise and interference often limit the useful range of a transmitter. Moreover, the use of small, lightweight batteries combined with limited channel bandwidth can necessitate infrequent messaging. In a noisy or lossy channel, messages can therefore be difficult to recover reliably.

One widely deployed form of electronic tracking is the Automatic Identification System (AIS) used in maritime vessels, and mandated in vessels over a certain size. AIS is designed for short-range communications and AIS transceivers typically transmit short infrequent messages. In a crowded environment, or over distances greater than intended in the AIS specification (e.g., from a space satellite platform), reliable reception can be difficult.

A complementary system, E-Navigation, is a concept developed by the International Maritime Organization (IMO) to improve safety and security of commercial shipping operations by facilitating better communication and organization of data between ships and shore-based facilities.

E-Navigation has been defined as the "harmonized collection, integration, exchange, presentation and analysis of marine information onboard and ashore by electronic means to enhance berth to berth navigation and related services for safety and security at sea and protection of the marine environment."

As such, e-Navigation incorporates and expands on a number of technologies, including AIS, Electronic Chart Display and Information System (ECDIS), Integrated Bridge Systems/Integrated Navigation Systems (IBS/INS), Automatic Radar Plotting Aids (ARPA), Long Range Identification and Tracking (LRIT) systems, Vessel Traffic Services (VTS) and the Global Maritime Distress Safety System (GMDSS).

Messaging between ships and other stations is a core requirement of e-Navigation. In part due to the mandated use of AIS in commercial shipping, the developers of e-Navigation have selected AIS as the messaging platform for e-Navigation.

AIS is a Radio Frequency (RF)-based communications and collision avoidance system for large SOLAS (Safety of Life at Sea) class vessels. AIS is designed for short-range (typically 20-30 nautical miles) ship-to-ship and ship-to-shore communications. The AIS system uses narrowband (i.e. 25 kHz Bandwidth) Very High Frequency (VHF) channels, at 161.975 MHz and 162.025 MHz for example, and—at least in the case of Class A transmitters—a communication method called Self-Organizing Time Division Multiple Access (SOTDMA). The ITU has also reserved additional channels for the use of AIS to support e-Navigation, and other organizing schemes may also be used in some cases (e.g., Class B transmitters may use Carrier Sense Time Division Multiple Access (CSTDMA)). It will be appreciated that messaging systems other than AIS can also be used with e-Navigation. Moreover, certain aspects (e.g., modulation scheme) of AIS and e-Navigation may be modified in the future.

Ships employing AIS broadcast key details every few seconds about their identification, current position, heading and speed, allowing the ships to select a safe course even when conditions prevent visual contact.

The AIS system supports a number of different types of signal. Conventionally, the principal AIS signal sent by a ship is a position report that provides information pertaining to the ship's identification, location, course, speed, and other details. The AIS also includes the use of a receiver, enabling a ship to receive AIS signals emitted by ships around it. Each minute, each VHF channel is divided into 2,250 time slots, each of which can accommodate one 26.67 ms AIS transmission (i.e. AIS signal). The time slots are accurately synchronized to Coordinated Universal Time (UTC), typically using Global Positioning System (GPS), and each AIS unit reserves time slots for future AIS transmissions from the ship. Other AIS units within range can therefore maintain a map of reserved slots and avoid transmitting during these intervals. This self-organizing feature avoids signal collisions over the short ranges involved in surface transmissions.

Since 2004, the IMO has required AIS transponders to be aboard all vessels that exceed 300 gross tons or passenger vessels of any size. Over 100,000 ships worldwide have installed these transponders at a combined cost of several hundred million dollars, making AIS one of the most successful maritime technology deployments of all time. Additionally, AIS technology is increasingly being deployed in smaller vessels and is also being installed in Aids-To-Navigation (AtoN) and Search and Rescue (SAR) vessels and aircraft. Since the deployment of AIS, the IMO has begun the process of defining e-Navigation. E-Navigation uses the AIS communication system to facilitate various e-Navigation requirements, and specifically will require the heavy usage of Application Specific Messages (ASMs).

ASMs allow for the definition of additional AIS message subtypes. Through the use of ASMs, AIS can be extended or leveraged to transmit a variety of other types of data. This extensibility is leveraged by e-Navigation to transmit other types of data. For example, IMO defines ASM subtypes for transmitting weather observation reports from ships, maritime traffic signals and berthing data, among others. ASMs can also be used to communicate free-form binary payloads.

The IMO, and others, have recognized that the use of ASMs within AIS and e-Navigation will continue to increase causing an ever more congested environment on the VDL (VHF Data Link) used for AIS and e-Navigation. This problem is particularly exacerbated in the case of satellite detection of AIS signals.

Although AIS was developed as a self-organizing system within a local radius of about 20-30 nautical miles, AIS signals can also be detected using low earth orbit (LEO) satellites. LEO satellites have a large field of view (FOV), typically measured in thousands of nautical miles, which means that the LEO satellite may receive signals from large numbers of ships at once. Due to the large FOV, the self-organizing features of AIS are not sufficient to prevent signal collisions in this scenario. As a result, LEO satellite reception leads to a large number of AIS signals colliding or overlapping with one another.

Moreover, many AIS signals may not be transmitted with sufficient power to be received without error at an LEO satellite. AIS Class A transmitters, such as those aboard large commercial vessels, have a transmit power level of 12.5 W, by default, which may not be sufficient to overcome noise or signal collisions in many cases. Moreover, AIS Class B transmitters, which can be found on small vessels, have less sophisticated transmitters limited to a power level of just 2 W and which transmit infrequently.

The population of small vessels is continuing to grow on the VDL. These vessels are of particular interest to security organizations as their ownership and purposes within national waters can be difficult to trace given that they operate outside the IMO and the SOLAS conventions. It is desired to use AIS, and LEO satellite detection, to track these vessels but their low power and infrequent transmissions make it very difficult to detect these vessels, particularly in congested areas.

Some of the described embodiments are generally directed to processing and transmitting e-Navigation (e.g., AIS) signals—one form of electronic tracking signal—in a way that significantly improves the likelihood of reception even when transmitted at low power, and to receiving and processing the e-Navigation signals to reliably recover the message data even in the presence of channel interference and bit errors that might cause a conventional receiver to discard the signals.

Other embodiments employ analogous techniques with other electronic tracking systems, which can be used, for example, to monitor vehicles or other objects on land, such as rail cars or modal shipping containers. For example, the described embodiments may be used in a lightweight alternative to the Global System for Mobile Communications-Railway (GSM-R) standard for railway communication and applications.

Still other embodiments employ analogous techniques to provide robustness for machine-based communications in tracking applications and elsewhere. For example, embodiments may be used in low power transponders for micro- and nanoscale devices, or in other devices with constrained power budgets, to facilitate message robustness for transmissions from primarily one-way communications devices, such as personal locator beacons or other emergency communication devices, which are often used in sparsely populated areas with few receiving devices in receiving range.

For greater certainty, the described embodiments are not limited to applications that rely on TDMA communication schemes, but rather may be applied to various other communication schemes, including but not limited to frequency division multiple access (FDMA), code division multiple access (CDMA) and others.

For example, a message format is described herein with binary-level features that enhance detection in the presence of noise or other forms of interference (including system self-interference). In some specific embodiments, the message format may also contain additional content, such as historical data, that enhances the utility of messages to a monitoring party.

Moreover, the described embodiments can be provided in such a way as to be compliant with some existing transmission standards (e.g., AIS), or backward compatible with conventional data communications systems.

Some embodiments incorporate one or more of a unique payload message format, transmission enhancements, network operations, and processing enhancements to provide for the reliable detection—using land-based, ship-based, airborne or satellite receivers—of a large number of distributed radio frequency transmitters, each of which may autonomously transmit a data packet at pre-defined or nominal intervals.

Referring now to FIG. 1A, there is shown a simplified schematic diagram of an example electronic tracking system, in the form of e-Navigation system 100. System 100 has at least one LEO satellite 150, which receives e-Navigation message signals transmitted by one or more ship-based transmitters 110, one or more small vessel transmitters 115, and other transmitters, such as a ground-based transmitter 120. LEO satellite 150 can transmit data corresponding to the received message signals to a ground station 180. In some embodiments, LEO satellite 150 may perform post-processing and recovery of the received message signals on-board. In other embodiments, LEO satellite 150 may re-transmit raw signal data to one or more ground stations 180 for post-processing and recovery.

In embodiments where e-Navigation employs AIS-based communications, a given ship transmitter 110 will typically transmit AIS signals over a number of narrowband (i.e. 25 kHz) VHF channels. Examples of AIS VHF channels include AIS1 at 161.975 MHz and AIS2 at 162.025 MHz. As noted above, other AIS channels also exist and may be used, and still further channels—which may use varying modulation types and channel bandwidth—may be added globally or regionally from time to time, in order to facilitate e-Navigation or maritime communication services. The present embodiments may be used with any combination of channels. To transmit an AIS signal, the transmitting unit employs a 9.6 kbps Gaussian minimum shift keying (GMSK) modulation. The LEO satellite 150 is equipped with at least one VHF antenna and receives the AIS signal transmitted by the ship. The LEO satellite 150 travels at a high orbital velocity, such as 7,500 m/s for example, and consequently the AIS signal received by the LEO satellite 150 may undergo a Doppler shift of up to +/−5.0 kHz.

In the embodiments described herein, transmitters 110, 115 and 120 may generate and transmit AIS signals as described with reference to FIGS. 5A and 5B.

Received AIS signals may be filtered and pre-processed using known techniques for receiving AIS messages. For example, the received AIS signal may be narrowband filtered to isolate the AIS channels of interest. The receiver may then attempt to identify a candidate message in the signal data, for example by locating an AIS training sequence in the signal data.

Once a candidate message is identified, GMSK demodulation is performed followed by Non-Return to Zero Inverted (NRZI) decoding, de-stuffing and bit reversal to recover the AIS message bit sequence.

The AIS message cyclic redundancy check (CRC) code may be verified at this stage, to determine if any errors are present in the recovered AIS message bit sequence. Conventionally in AIS message processing, if the CRC verification fails, the message data is discarded. However, in the embodiments presented here, processing can continue even in the presence of one or more bit errors in the AIS candidate message. Accordingly, the top level CRC verification may be omitted in some embodiments described herein.

Once the AIS message bit sequence is recovered, the system proceeds to payload processing for each AIS message bit sequence, as described with reference to FIGS. 6A and 6B.

Figure 1B:
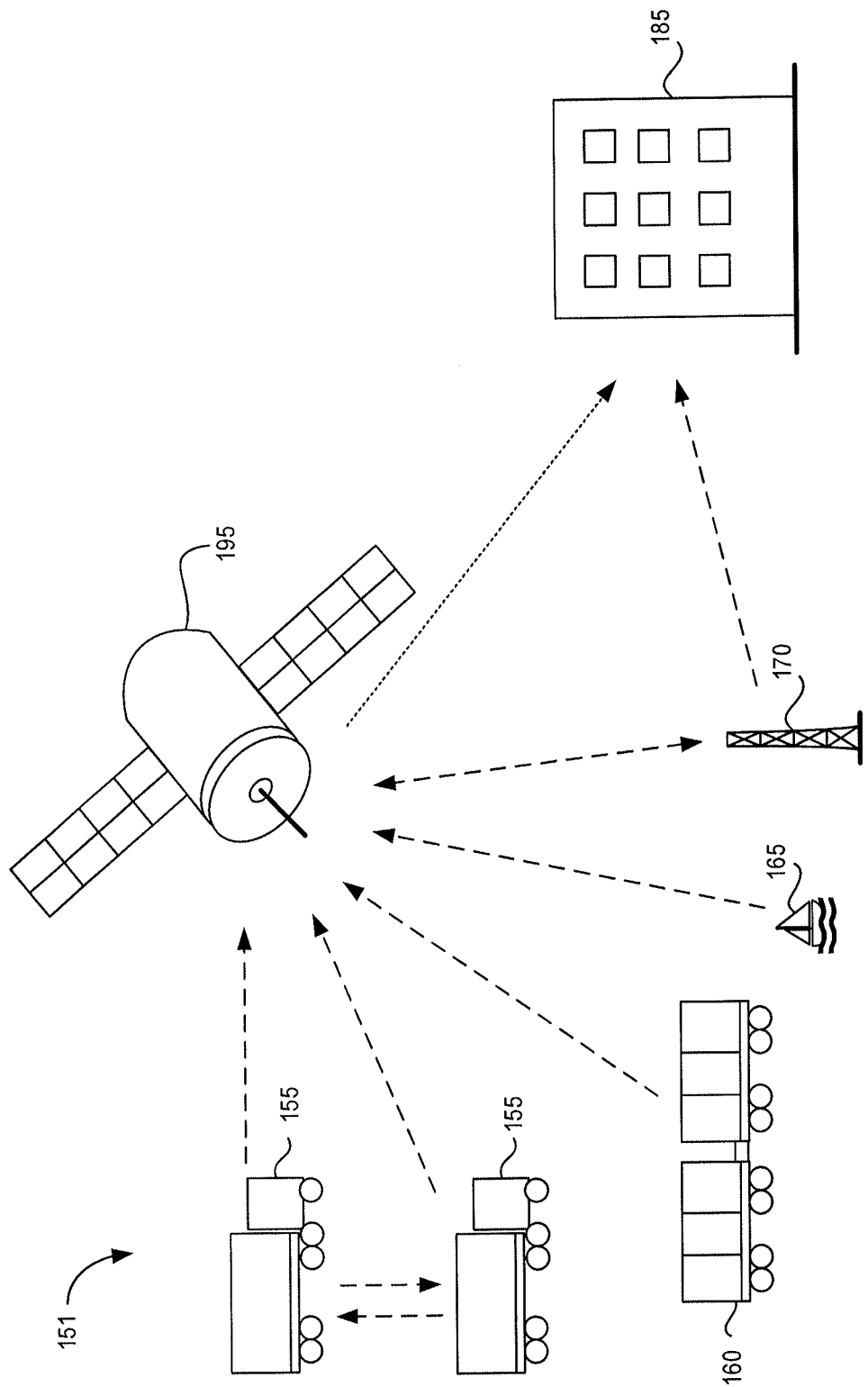
FIG. 1B is a simplified schematic diagram illustrating components of other example electronic tracking systems.

Referring now to FIG. 1B, there is shown a simplified schematic diagram of another example electronic messaging system 151. System 151 may have at least one LEO satellite 195, which can receive message signals transmitted by one or more transmitters 155, such as an automobile, freight truck, personal locator beacons. In some cases, transmitters 155 may also transmit and/or receive communications from other transmitters 155, without the involvement of LEO satellite 195. Various other transmitters 160 (e.g., rail car or modal container based), personal transmitters 165, and other transmitters, such as a ground-based transmitter 170 may also be used, each of which may also transmit and receive messages from one or more other type of transmitter. LEO satellite 195 can transmit data corresponding to the received message signals to a ground station 185. In some embodiments, LEO satellite 195 may perform post-processing and recovery of the received message signals on-board. In other embodiments, LEO satellite 195 may re-transmit raw signal data to one or more ground stations 185 for post-processing and recovery. Although described herein in terms of transmission from ground- or sea-based transmitters to a satellite receiver, in some cases, transmission and reception may be reversed. For example, LEO satellite 195 may transmit to ground- or sea-based receivers, if transmitters 155, 160, 165 or 170 are so equipped and the teachings herein may be applied accordingly.

Depending on the application, transmitters 155, 160, 165 and 170 can be configured to transmit on specific frequencies (e.g., unlicensed frequency bands). Each transmitter may use varying modulation types and channel bandwidth according to the specific application. The present embodiments may be used with any combination of channels. The LEO satellite 195 and other receiving devices can be equipped with suitable antennas and receiving equipment. The LEO satellite 195 may travel at a high orbital velocity, such as 7,500 m/s for example, and consequently the message signals received by the LEO satellite 150 may undergo a Doppler shift of up to +/−5.0 kHz. The precise Doppler shift is dependent on the frequency of the carrier signal, therefore Doppler shift may be considerably higher for carrier frequencies above VHF.

In the embodiments described herein, transmitters 155, 160, 165 and 170 may generate and transmit message signals as described with reference to FIGS. 5A and 5B.

Received message signals may be filtered and pre-processed using known techniques. For example, the received signal may be narrowband filtered to isolate channels of interest. The receiver may then attempt to identify a candidate message in the signal data, for example by locating a training sequence in the signal data, or by other suitable techniques, such as Viterbi decoding.

Once a candidate message is identified, demodulation can be used to recover the message bit sequence. Depending on the additional coding used in the message, decoding, de-stuffing and bit reversal may also be performed when recovering the message bit sequence.

If present, a message cyclic redundancy check (CRC) code may be verified at this stage, to determine if any errors are present in the recovered message bit sequence. Conventionally in message processing, if the CRC verification fails, the message data is discarded. However, in the embodiments presented here, processing can continue even in the presence of one or more bit errors in the candidate message. Accordingly, the top level CRC verification may be omitted in some embodiments described herein.

Once the message bit sequence is recovered, the system proceeds to payload processing for each message bit sequence, for example as described with reference to FIGS. 6A and 6B.

Figure 2:
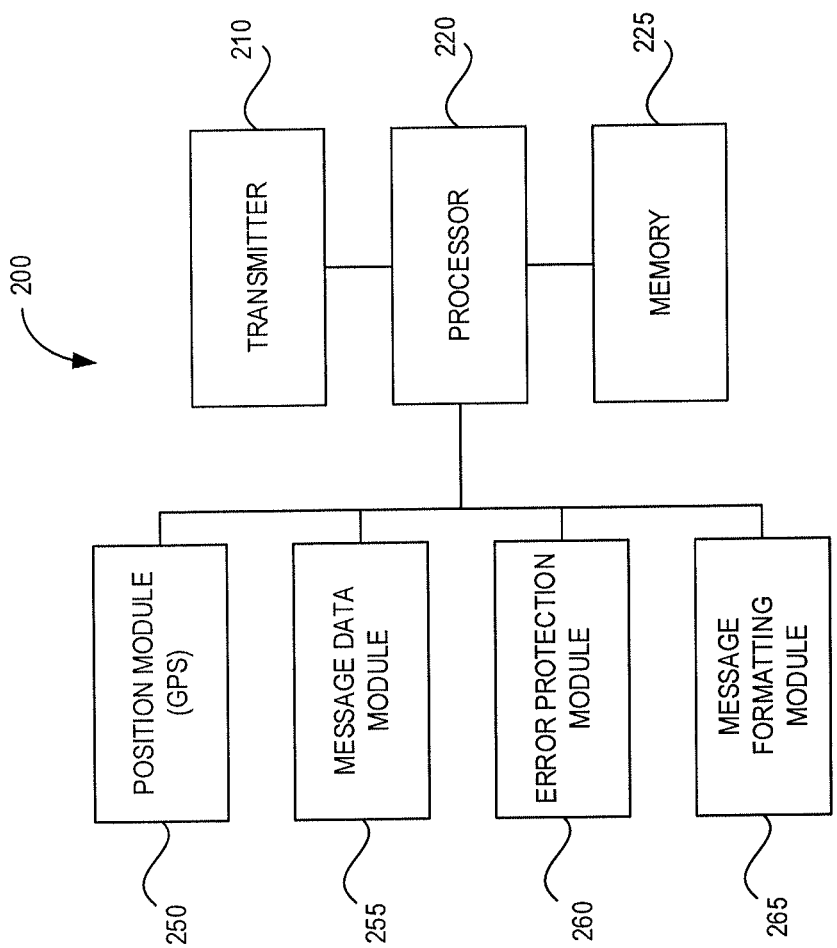
FIG. 2 is a system block diagram of an example electronic tracking transmitter for the systems of FIG. 1A and FIG. 1B.

Referring now to FIG. 2, there is illustrated a system block diagram for a transmitter in some example embodiments. Transmitter 200 may be used in the transmitters of FIG. 1A or 1B, for example.

Transmitter 200 includes a processor 220, memory 225 (which may include volatile and non-volatile memory) and an RF transmitter stage 210. RF transmitter stage 210 includes one or more amplifiers, filters and antennas, for example, used to transmit a message signal.

Processor 220 may be a general purpose microprocessor or micro-controller, field programmable gate array, application specific processor, or other computing device. Processor 220 can be configured to perform various tasks, such as monitoring position data from position module 250, determining object status, generating maneuver indications, maintaining historical information (e.g., stored in memory 225). It will be appreciated that processor 220 can perform various other tasks dependent on available or installed software. Based on these tasks, processor 220 can generate message data for transmission in a tracking message. Message data may include any free-form data, which may depend upon the specific application.

Transmitter 200 further comprises a position module 250, a message data module 255, an error protection module 260 and a message formatting module 265. In some embodiments, various modules, such as error protection module 260 and message formatting module 265, may be combined into a single module, or may be divided into various sub-modules. In some embodiments, one or more modules, such as position module 250, may be omitted.

Position module 250 is a receiver for a satellite navigation system, such as the Global Positioning System (GPS, Galileo, or the Global Navigation Satellite System (GLONASS). Position module 250 is generally capable of determining a present location of transmitter 200 and a current time, and supplying this data to processor 220.

Message data module 255 receives message data from processor 220 and generates binary payload data, based on the received message data, for inclusion in a message signal transmission.

Error protection module 260 receives the binary payload data and encodes the binary payload data using at least one error protection scheme as described with reference to FIGS. 5A and 5B.

Message formatting module 265 receives the encoded binary payload data and encapsulates the encoded binary payload data in a message wrapper for transmission, as described with reference to FIGS. 5A and 5B. For example, in the e-Navigation context, the message wrapper may be a properly-formatted AIS ASM. In other contexts, the message wrapper can be sparse, comprising only some synchronization features, such as a message preamble, or end flag. Generally, the preamble (sometimes also called a prefix, training sequence or start flag) indicates that a message follows. Optionally, the message wrapper can include a message delimiter to indicate where the data begins, or the data length, or both. In some cases, the message preamble and delimiter may be combined. If present, an end flag or postamble can be a predefined sequence to identify the end of a data sequence. The end flag or postamble can be omitted in embodiments where a message data length is provided (e.g., in the preamble or delimiter), or where message data length is fixed.

In some embodiments, transmitter 200 operates at low power levels. For example, in the e-Navigation context, transmitter 200 may operate with an AIS Class B standard power level of 2 W, or less.

Transmitter 200 provides an enhanced level of message detection compared to standard message transmitters (at the same RF power level) in the presence of: other transmitters, or in areas with a high density of like messaging transmitters using these enhanced detection features, or both. In other words, the fundamental detectability (successful receipt of an error free binary payload message from the new message type from the described transmitter) is higher than for an unmodified message. Thus any given channel may be used to support a larger number of transmitters, effectively improving the channel capacity beyond current levels.

Transmitter 200 also provides improvements in both timing and synchronization of messages as well as signaling enhancement to assist in error free reception of these messages from space (e.g., forward error correction and other features to enhance detection performance).

Transmitter 200 can be compatible with some existing modulation, channelization, message standards and signaling protocols, and relatedly no new modulation scheme or digital baseband circuitry is required for the transceiver. For example, transmitter 200 may be compatible with existing AIS infrastructure.

Transmitter 200 has low processing load requirements to encode messages. Thus microcontrollers can be used, avoiding the need for advanced processors and/or floating point calculations.

Transmitter 200 can be configured for different types of behaviors at the factory or in the field via a firmware upgrade. Accordingly, transmitter 200 can be configured to operate in a 'closed' system, in which all messages it sends are proprietary. Alternatively, transmitter 200 can operate in a hybrid mode, by providing some or all enhanced features to a compatible network (ground, satellite, etc.) infrastructure, while still occasionally transmitting standards-compliant messages as required.

Moreover, the behavior of transmitter 200 can optionally be modified over time via over-the-air programming, or over another wired or wireless link (e.g., Wi-Fi or USB).

Figure 3:
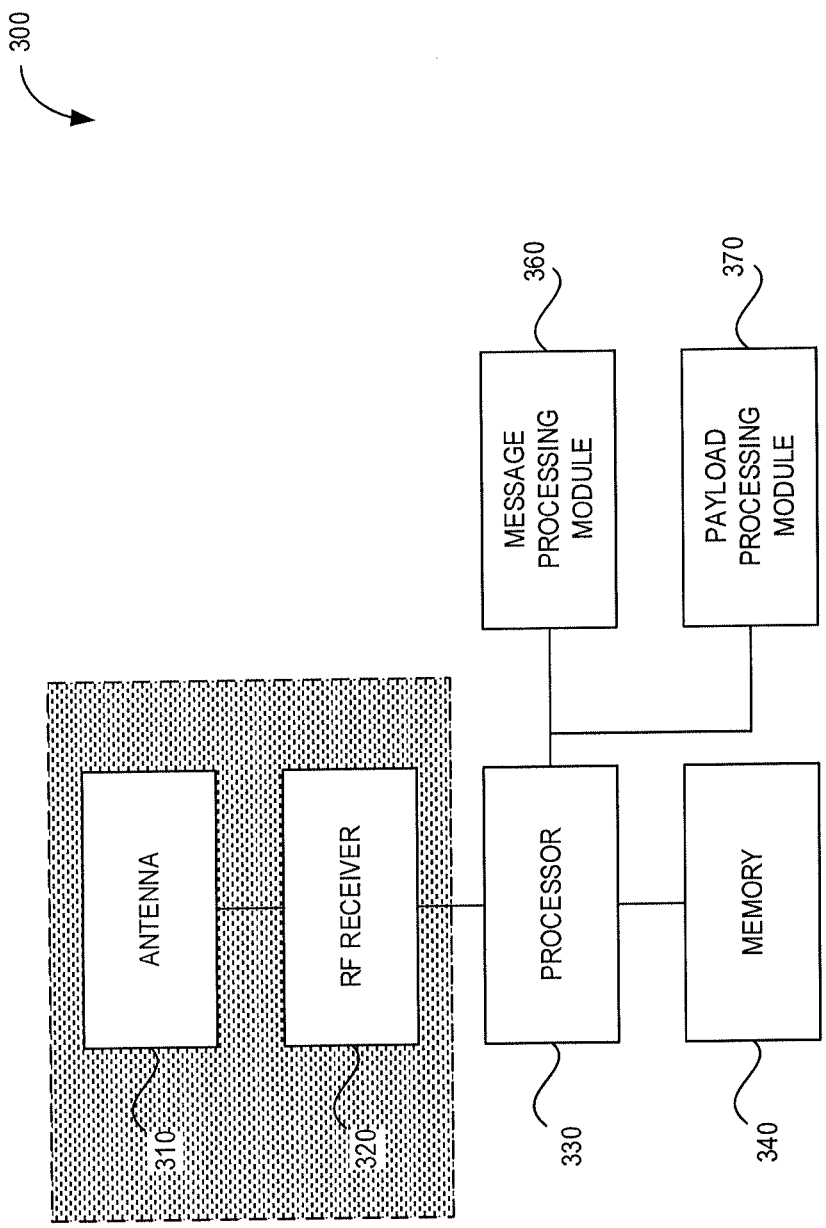
FIG. 3 is a system block diagram of an example electronic tracking receiver for the systems of FIG. 1A and FIG. 1B.

Referring now to FIG. 3, there is illustrated a system block diagram for a receiver in some example embodiments. Receiver 300 may be used in LEO satellites 150 or 195 or ground stations 180 or 185, for example.

Receiver 300 includes a processor 330, memory 340 (which may include volatile and non-volatile memory), one or more antennas 310, and an RF receiver stage 320.

Receiver 300 further includes a message processing module 360 and a payload processing module 370. In some embodiments, message processing module 360 and payload processing module 370 may be combined into a single module, or may be divided into various sub-modules.

Processor 330 may be a general purpose microprocessor, field programmable gate array, application specific processor, or other computing device. Processor 330 can be configured to control the operation of the various modules, and to receive and further process message data recovered from message signals.

RF receiver stage 320 includes one or more filters and amplifiers to pre-process signal data received by antenna 310. Pre-processed signal data is provided to message processing module 360, which identifies candidate message signals and performs demodulation and, where appropriate based upon the message, decoding, de-stuffing and bit reversal to recover input signal data, for example a message bit sequence.

Payload processing module 370 receives the input signal data and extracts the binary payload encapsulated within a message wrapper. Payload processing module 370 further decodes at least one error protection encoding scheme of the binary payload to recover message data.

Figure 4:
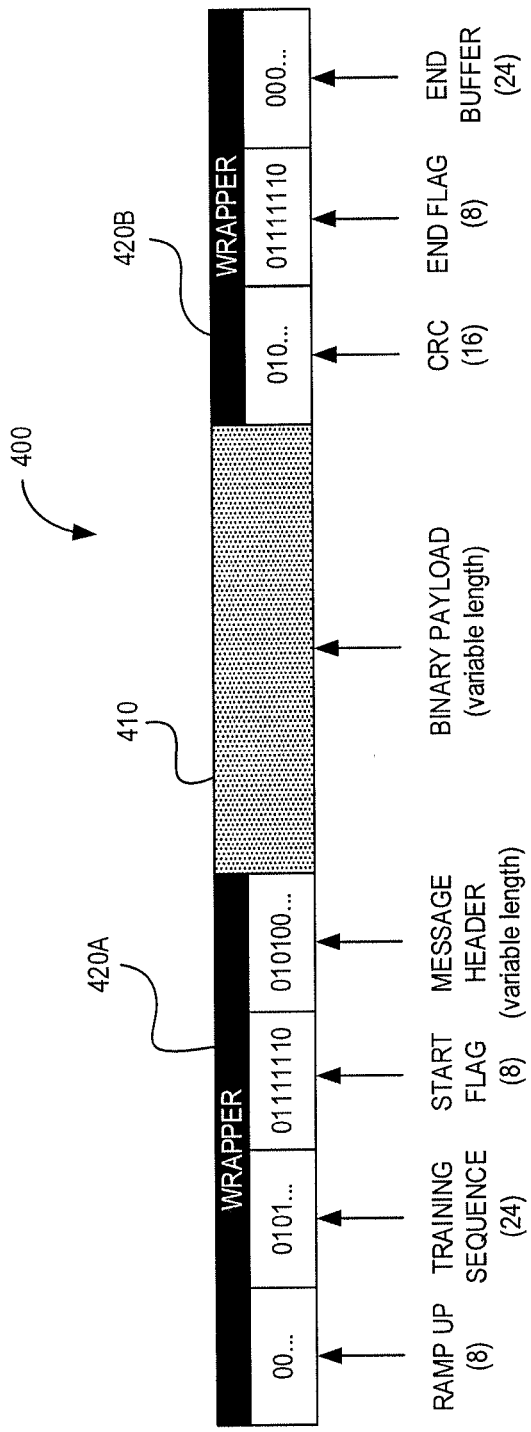
FIG. 4 is a diagram illustrating the data structure of an example electronic tracking message signal.

Referring now to FIG. 4, there is shown a diagram illustrating the data structure of an example message signal 400 and, in particular, an example e-Navigation AIS message signal. The AIS message signal 400 generally comprises a binary payload portion 410 encapsulated within a message wrapper. The message wrapper is illustrated as having a first wrapper portion 420A that precedes the binary payload portion 410 in the message bit sequence, and a second wrapper portion 420B that follows the binary payload portion 410 in the message bit sequence. For ease of understanding, the first wrapper portion 420A and second wrapper portion 420B are collectively referred to herein as the message wrapper 420.

In embodiments where AIS communications are used for e-Navigation, message wrapper 420 contains fields required to form a valid, standards-compliant AIS message. For example, a ramp up field (8 bits), an AIS training sequence (24 bits), and a start flag (8 bits). A variable length message header may also be included, containing other fields such as a message identification, a repeat indicator, a Maritime Mobile Service Identity (MMSI), an application identifier, and a spare field. Finally, a frame check sequence (e.g., CRC) field, a buffer field or bit stuffing and a stop flag may be included to complete the AIS message.

The AIS training sequence field is included to allow conventional AIS receivers to perform carrier recovery. The training sequence field, the start flag field and the end flag field are predetermined AIS code sequences that can be used by various embodiments described herein to identify candidate message signals.

The frame check sequence field is used for error detection, and can be used to determine whether bit errors are present in the AIS message following transmission and reception. The buffer field may change in length and is used to ensure that the overall AIS message signal length remains constant.

The binary payload 410 may contain predetermined freeform data of any type. In practice, the binary payload 410 may be sub-divided into a plurality of pre-defined fields, which may overlap with or introduce new data not found in standard AIS position report messages. A comparison of payload fields between standard AIS position report message and an enhanced e-Navigation message, in accordance with some embodiments, is shown in Table 1 below.

TABLE 1

| Field Name | Number of Bits | |
|---|---|---|
| | Default AIS | e-Navigation |
| Navigational status | 4 | 4 |
| Rate of turn (ROT) | 8 | 0 |
| Speed over ground (SOG) | 10 | 10 |
| Position accuracy | 1 | 0 |
| Longitude | 28 | 24 |
| Latitude | 27 | 23 |
| Course over ground (COG) | 12 | 0 |
| True heading | 9 | 0 |
| Time stamp | 6 | 0 |
| Maneuver indicator | 2 | 0 |
| Spare | 3 | 6 |
| Receiver autonomous integrity monitoring (RAIM) flag | 1 | 0 |
| Radio status | 19 | 0 |
| History information (e.g., track data) | 0 | 40 |

It can be seen in Table 1 that the e-Navigation message payload may omit certain fields found in an AIS position report, such as ROT, COG and radio status. However, in some embodiments, new payload fields may be introduced that include history information and vessel course history (e.g., over 1 hour, over 3 hours, etc.). Such information may be useful in satellite-based monitoring, where it may not be possible to reliably receive all position reports transmitted by a vessel.

The message length of standard AIS messages is subject to some constraints based on bit rate (i.e., 9.6 kbps) and slot length (i.e., 26.67 ms), longer messages may be still be transmitted by using two or more slots in the AIS system. Accordingly, in some cases, an e-Navigation message may occupy two or more slots. In other cases, an e-Navigation message may occupy fractional time slots, for example one and a half time slots, and still be a valid AIS message.

Although AIS message signals are illustrated with respect to FIG. 4, other embodiments can employ various other message formats. For example, some message formats may omit certain parts of an AIS message signal, such as the training sequence or message header. Likewise, other message formats may introduce other message parts, such as redundant data fields. However, each of the message formats contains a binary payload encoded with error protection encoding in the manner described herein with reference to FIGS. 5A and 5B.

Figure 5A:
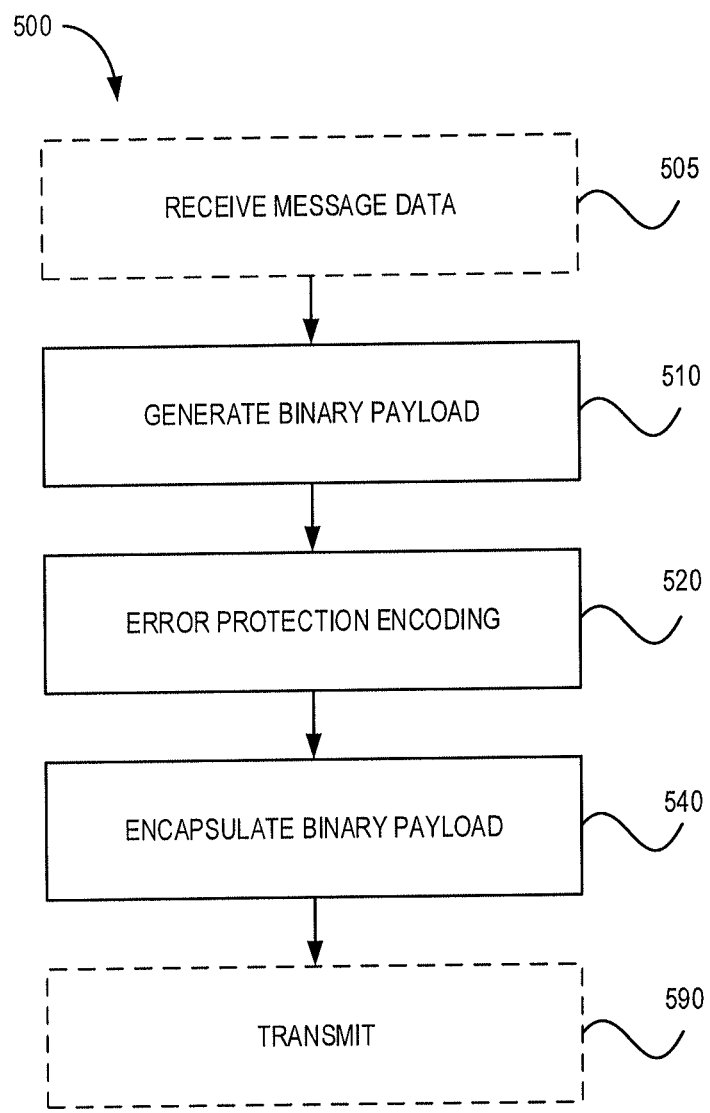
FIG. 5A is a flow diagram for an example method of generating an electronic tracking message with enhanced detectability.

Referring now to FIG. 5A, there is illustrated a flow diagram for an example method 500 of generating a message signal with enhanced detectability. Method 500 may be carried out, for example, by transmitter 200 of FIG. 2.

As described above, the generated message can contain a binary payload with proprietary content. The binary payload can be encapsulated in a message wrapper to be compliant with industry standard messaging formats, such as AIS.

The described embodiments generally introduce powerful coding and redundancy information within the binary payload, which enables detection and recover of message data at much lower receive power levels and with higher levels of interference. This allows message data to be recovered even if the message is corrupted by bit errors, and even if the initial CRC verification fails.

In general, one or more error protection (which may also be called error correction or error recovery) encoding schemes is applied to the binary payload in order to maximize the probability of detecting this portion of the message at the receiver.

Method 500 begins by receiving message data 505, using message data module 255 of FIG. 2, for example. Message data is assembled by the transmitter and, in the e-Navigation context, may include information such as historical position (track) history, speed, heading, time, position co-ordinates, etc. Message data may further include fields at the start or end of the message to assist in efficient decoding, such as an identifier for standard binary (and complete) message lengths, or types.

In other embodiments, various other message data may be assembled. For example, in a rail car tracking system, a rail car identification, cargo identification and various other information may be assembled.

Optionally, an internal CRC or other error detection scheme may be computed and appended to the message data.

The message data is then combined and a raw binary payload is generated at 510. Generation of the raw binary payload may include, for example, conversion of floating point numbers to fixed length integer representations, and other source coding operations, such as conversion of text data into binary form, and the like. Optionally, the raw binary payload may be encrypted (not shown) to protect against unwanted users or listeners.

At 520, the raw binary payload is encoded with at least one error protection encoding scheme, using error protection module 260 of FIG. 2, for example.

Error protection encoding schemes generally employ forward error correction, and may take the form of block coding, repetition coding, convolutional coding and interleaving, and combinations thereof.

In some embodiments, other encoding schemes may also be used, such as linear codes, Hamming codes, cyclic codes, and the like. It will be appreciated that these are merely provided as examples and many other forward error correction codes may be used, including those that are hybrids of the listed examples.

Depending on message length and application, different coding types and rates may be employed. For example, in some embodiments Low Density Parity Check (LDPC) coding may be used.

In some other embodiments, a joint coding and modulation approach may be used to minimize or avoid the need for bit stuffing or other modulation techniques. Bit stuffing may be required to maintain compatibility with existing conventional receivers. For example, in one joint coding and modulation approach, the error protection encoding may ensure that continuous strings of zeroes or ones are avoided, to remove the need for bit stuffing.

Repetition coding is a form of error correction that involves repeating a message one or more times, so that not all repeated messages are corrupted by bit errors. The receiver can also identify errors by comparing the repeated messages, and may be able to select the error-free messages from among a plurality of repeated messages (e.g., the most commonly occurring message may be determined to be free of errors).

Convolutional coding is a form of encoding data in which each m-bit information symbol (each m-bit string) to be encoded is transformed into an n-bit symbol, where m/n is the code rate and where n≥m. The transformation is generally a function (e.g., using generator polynomials) of the last k bits, where k is the constraint length of the code.

In the described embodiments, a 1/2 or 1/3 code rate is suitable for convolutional coding, although other code rates may also be used if the trade-off in efficiency is acceptable. In general, convolutional coding performs well with low signal-to-noise, but its bit error rate (BER) curve usually rolls-off slowly.

Interleaving (or scrambling), in which a linear sequence is rearranged and spread in time to provide robustness against error bursts, may also be used to enhance error protection. It will be understood that interleaving is not a form of error correction per se but rather a form of protecting against errors when used in combination with another technique, such as convolutional coding, block coding, or both. Interleaving distributes coded bits in time so that certain types of transmission corruption, specifically burst errors, do not have a disproportionate impact on the effectiveness of other coding techniques being used. Burst errors (e.g., due to multipath fading events, radio frequency interference, etc.) are common on radio channels, With interleaving, coding effectiveness is maintained both whether bit errors occur randomly throughout the message, or all in one or more bursts of clustered bit errors.

Block codes are generally error-correcting code schemes that encode data in blocks. In the described embodiments, suitable block codes include linear block codes such as Reed-Solomon (RS) and Bose-Chaudhuri-Hocquenghem (BCH) codes. For example, RS codes have fast BER curve roll off, and are well suited to correcting bursty errors common with a Viterbi decoder used to decode convolutional coding. In some embodiments, Turbo codes may also be used.

At 540, the error protection encoded binary payload is encapsulated in a message wrapper as described herein to form the completed message, using message formatting module 265, for example. For example, the message wrapper may be an AIS message wrapper including a ramp up field, an AIS training sequence, a start flag, an application identifier, a MMSI, a frame check sequence field computed for the message, a buffer, and a stop flag. In other embodiments, other fields may be added, as desired.

The completed message is then transmitted at 590 using a transmitter such as transmitter 210 of FIG. 2. In some embodiments, transmission may occur over specific frequencies (e.g., AIS channels 1 or 2). In other embodiments, new or dedicated frequencies may be used.

Figure 5B:
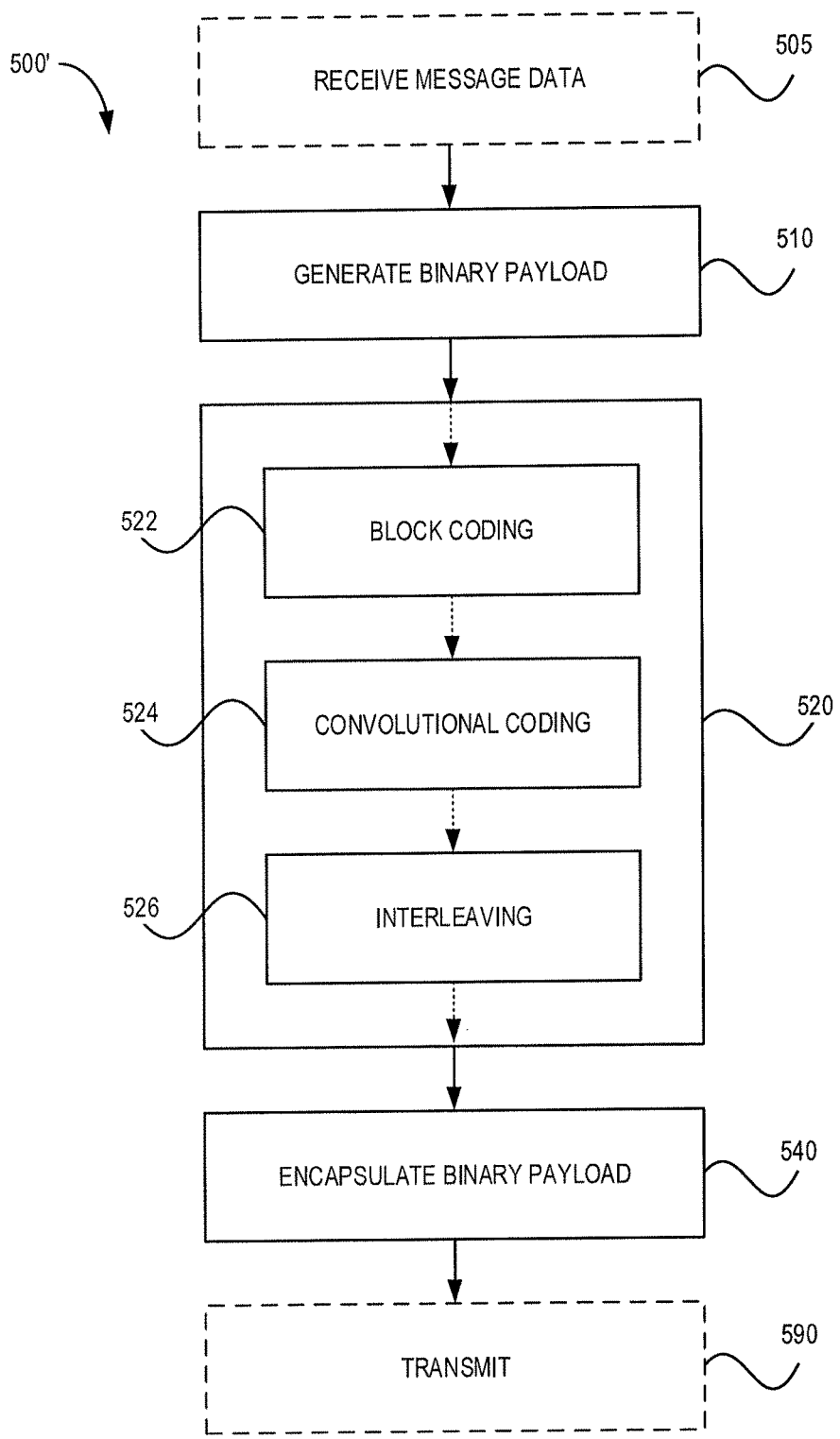
FIG. 5B is a flow diagram for another example method of generating an electronic tracking message with enhanced detectability.

Referring now to FIG. 5B, there is illustrated a flow diagram for another example method 500' of generating a message with enhanced detectability. Method 500' may be carried out, for example, by transmitter 200 of FIG. 2.

In general, acts of method 500' are analogous to those of method 500. Message data is received at 505 and a binary payload is generated at 510.

Method 500' differs from method 500 in that 520' illustrates additional detail of one specific error protection encoding approach. In particular, at 522 the raw binary payload is block encoded using RS coding or BCH coding, followed by convolutional coding (e.g., at a 1/2 or 1/3 code rate) at 524, and finally followed by interleaving at 526.

The error protection encoded binary payload is encapsulated in a message wrapper at 540 and transmitted at 590, as in method 500.

Figure 6A:
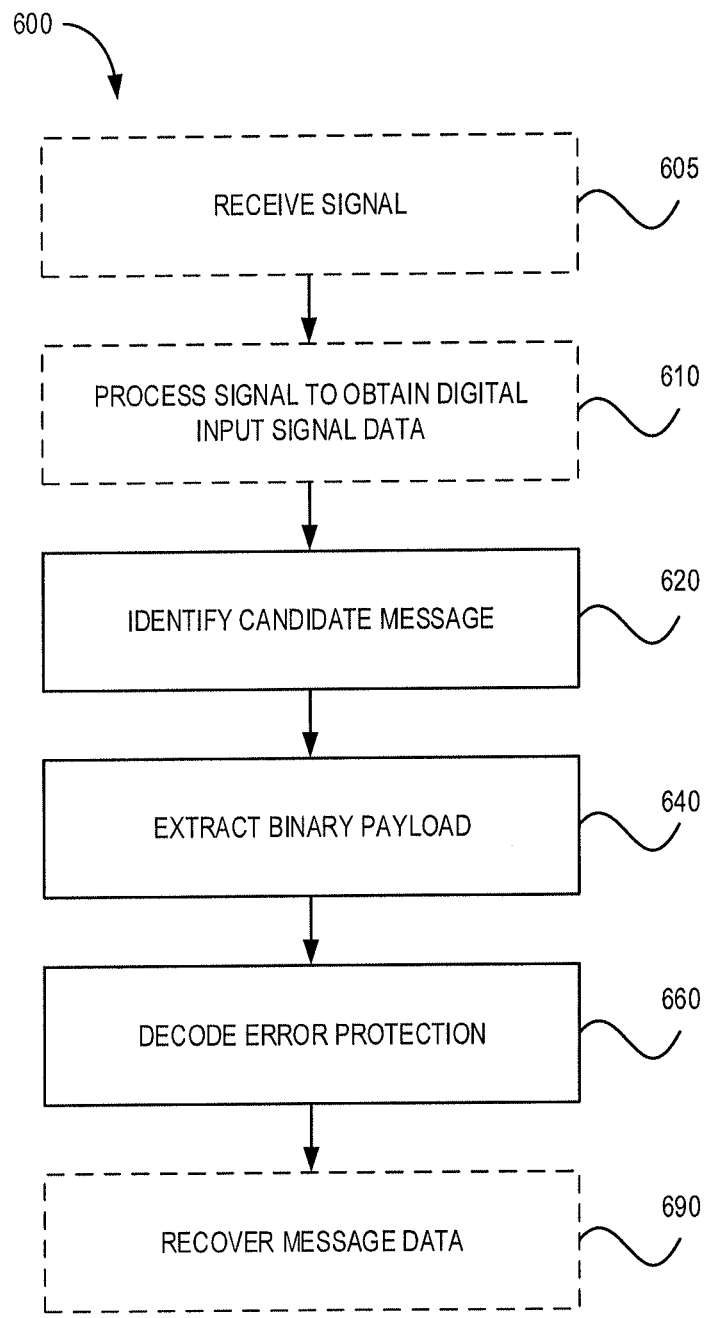
FIG. 6A is a flow diagram for an example method of receiving and processing an electronic tracking message with enhanced detectability.

Referring now to FIG. 6A, there is illustrated a flow diagram for an example method 600 of receiving and processing message with enhanced detectability. Method 600 may be carried out, for example, by receiver 300 of FIG. 3.

Method 600 begins at 605 by receiving a signal and generating pre-processed signal data, using at least one antenna 310 and RF receiver stage 320 of receiver 300, for example.

At 610, the pre-processed signal data is processed by message processing module 360, for example, which may perform GMSK demodulation followed by Non-Return to Zero Inverted (NRZI) decoding, de-stuffing and bit reversal to recover input signal data.

At 620, a candidate message may be identified in the input signal data. Candidate messages may be identified, for example, by correlating the input signal data with predetermined sequences. For example, in the AIS context, the standard 24-bit AIS training sequence may be used to perform correlations. Other known sequences in AIS messages, such as the start flag and end flag, or AIS message type, may also be used. In some embodiments, still other fields or bit sequences of the message may be used when they are known by the receiver or processor. Various other techniques for identifying candidate messages may also be used.

In some cases, identification of candidate messages may exploit one more diversity schemes implemented at the transmitter, in addition to those described herein.

In conventional receivers, once a candidate message is identified, the FCS may be used to validate the message data. For example, a CRC validation may be used to determine whether the message data contains one or more bit errors. In conventional receivers, the detection of bit errors generally causes the receiver to discard the message data. However, in the described embodiments, processing of the candidate message may continue even in the presence of one or more bit errors, as determined by the FCS or CRC validation.

Once a candidate message is identified, the binary payload can be extracted at 640. In some embodiments, the binary payload may be determined by computing one or more bit offsets from one or more predetermined features (e.g., training sequence, start flag, message type, end flag, etc.) of the candidate message. For example, in AIS, a bit offset from the AIS training sequence may be used to identify the start of the binary payload and the payload may be extracted based on an expected message length or by extracting data until a FCS field or end flag is found.

The predetermined bit offset length may not be fixed in all cases since messages may contain extra bits inserted to avoid long sequences of a repeated bit. For example, in AIS, if the MMSI of a vessel contains five repeated bits (e.g., 1's), an opposite bit may be inserted to prevent loss of synchronization at the receiver. Accordingly, the predetermined bit offset may be variable in length, and the length may be computed taking into account bitstuffing in a message. Once the error protection encoded binary payload is extracted from the candidate message, the error protection may be decoded at 660. Decoding generally involves reversal of the encoding actions performed by the transmitter (e.g., transmitter 200). For example, if the error protection encoding comprised block coding followed by convolutional coding and interleaving, then the error protection decoding may comprise de-interleaving, Viterbi decoding the convolutional coded sequence and block decoding.

Following decoding of the error protection scheme or schemes, the message data may be recovered at 690. Recovery of message data generally includes performing operations to reverse the source coding applied by the transmitter when generating the raw binary payload (e.g., at 510 of method 500).

Figure 6B:
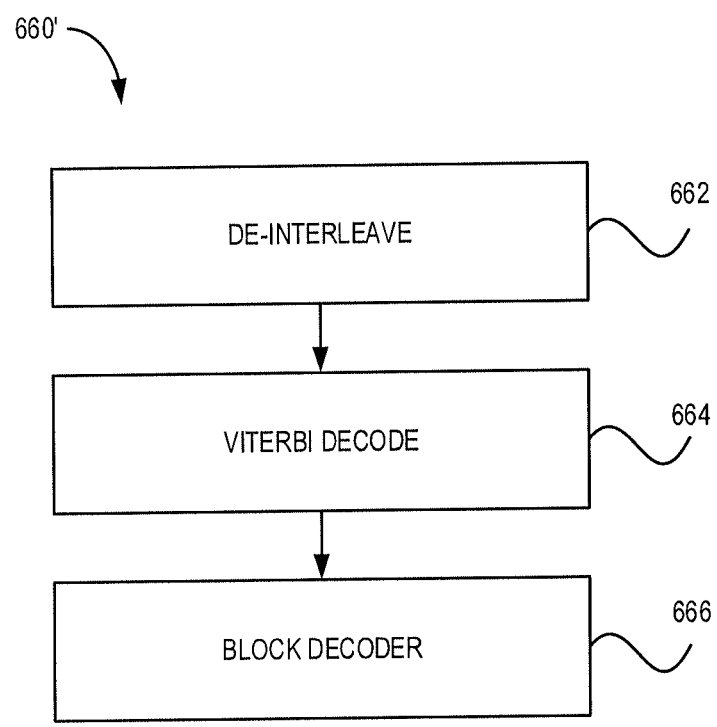
FIG. 6B is a flow diagram for an example error protection decoding approach complementary to the encoding approach of FIG. 5B.

Referring now to FIG. 6B in particular, there is shown a flow diagram for an example error protection decoding approach that is complementary to the encoding approach of FIG. 5B.

Error protection decoding 660', which can be performed at 660 of method 600, begins with de-interleaving or de-scrambling the encoded binary payload at 662, according to the predetermined interleaving scheme used, for example, at 526 of FIG. 5B.

At 664, a Viterbi decoder can be used to decode the convolutional coding of the binary payload applied, for example, at 524 of FIG. 5B. In some other embodiments, various other sequential decoding algorithms may be used to decode the convolutional coding.

At 666, a block decoder can be used to decode the block coding applied to the binary payload, for example at 522 of FIG. 5B.

Comparisons of the expected bit error rate (BER) and packet error rate (PER) for e-Navigation messages with the described enhanced detectability have shown significant improvements over standard AIS ASMs in terms of the probability of receiving bits and the complete binary payload message in the presence of noise.

In one example, packet error rate comparisons were performed for dual slot messages ("packets") that were 1/2 rate convolutional coded. The comparison demonstrated a 5 to 6 dB lower detection threshold for the convolutional coded messages, than unencoded half-packets (i.e., single slots of the dual slot message). From an information theory perspective, the 1/2 rate encoded full packet has the same information content as the uncoded half-packet. This detection threshold advantage can be interpreted as achieving a receiver detection performance equivalent to an unencoded message transmitted with nearly four times the power. That is, an encoded message transmitted at a 2 W power level can be as detectable as an unencoded message transmitted at an 8 W power level.

Accordingly, the described embodiments provide a significant overall enhancement to detectability of messages, such as e-Navigation messages, in noisy and congested channels. In general, the described receivers may make use of a priori knowledge of the binary sequences in both the message wrapper and binary payload, which maximizes the probability of detecting messages using an optimum decoding and processing approach.

To facilitate the described detection approaches, corresponding transmitters can be easily incorporated into new or existing transponders. Existing transponders may require changes to internal message assembly and coding algorithms. Additionally, message frequency and co-ordination (scheduling) may need to be programmed in the language of the transponder controller or processor, which may accomplished through a firmware update in many cases.

In some embodiments, existing transponders may continue to be used with little or no modification.

Although described herein in some cases with reference to e-Navigation and AIS, the present embodiments may also be applied to other applications and systems, not limited to known or future maritime communications signaling standards and protocols, such as Vessel Traffic Service (VTS).

The embodiments of the methods and systems described herein may be implemented in hardware or software, or a combination of both. These embodiments may be implemented in computer programs executing on programmable computers, each computer including at least one processor, a data storage system (including volatile memory or non-volatile memory or other data storage elements or a combination thereof), and at least one communication interface.

Program code is applied to input data to perform the functions described herein and to generate output information. The output information is applied to one or more output devices, in known fashion.

Each program may be implemented in a high level procedural or object oriented programming or scripting language, or both, to communicate with a computer system. However, alternatively the programs may be implemented in assembly or machine language, if desired. The language may be a compiled or interpreted language. Each such computer program may be stored on a storage media or a device (e.g., ROM, magnetic disk, optical disc), readable by a general or special purpose programmable computer, for configuring and operating the computer when the storage media or device is read by the computer to perform the procedures described herein.

Furthermore, the systems and methods of the described embodiments are capable of being distributed in a computer program product including a physical, non-transitory computer readable medium that bears computer usable instructions for one or more processors, where the instructions, when executed by the one or more processors, cause the computer to perform the functions described herein. The medium may be provided in various forms, including one or more diskettes, compact disks, tapes, chips, magnetic and electronic storage media (e.g., firmware), and the like. Non-transitory computer-readable media comprise all computer-readable media, with the exception being a transitory, propagating signal. The computer useable instructions may also be in various forms, including compiled and non-compiled code.

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing implementation of the various embodiments described herein. The scope of the claims should not be limited by the preferred embodiments and examples, but should be given the broadest interpretation consistent with the description as a whole.

The invention claimed is:

1. A method of generating an electronic tracking message with enhanced detectability, the method comprising:
   generating a binary payload;
   error protection encoding the binary payload; and
   encapsulating the binary payload in a message wrapper to produce the electronic tracking message.

2. The method of claim 1, wherein the error protection encoding is selected from one or more of the group consisting of block coding the binary payload, convolutional coding the binary payload and interleaving the binary payload.

3. The method of claim 1, wherein an error protection scheme used in the error protection encoding is selected from one or more of the group consisting of Low Density Parity Check coding, Turbo coding, Bose-Chaudhuri-Hocquenghem coding, and Reed-Solomon coding.

4. The method of claim 1, wherein the error protection encoding comprises joint coding and modulation.

5. A method of recovering message data from an electronic tracking signal, wherein the message data is encoded with error protection encoding, the method comprising:
   receiving input signal data, the input signal data having been produced by demodulating and decoding the electronic tracking signal;
   identifying a candidate message in the input signal data;
   extracting a binary payload from the candidate message, the binary payload comprising at least one error protection encoding; and
   decoding the at least one error protection encoding of the binary payload to recover the message data.

6. The method of claim 5, wherein the candidate message contains one or more bit errors.

7. The method of claim 5, wherein the at least one error protection comprises interleaving, and wherein the decoding comprises de-interleaving the binary payload.

8. The method of claim 5, wherein the at least one error protection comprises convolutional coding, and wherein the decoding comprises Viterbi decoding.

9. The method of claim 5, wherein the at least one error protection comprises block coding, and wherein the decoding comprises block decoding.

10. The method of claim 5, wherein the at least one error protection is selected from one or more of the group consisting of Low Density Parity Check coding, Turbo coding, Bose-Chaudhuri-Hocquenghem coding, and Reed-Solomon coding.

11. The method of claim 5, wherein the candidate message is identified by correlating at least a portion of the candidate message to a predetermined sequence.

12. The method of claim 5, wherein the binary payload is extracted using a predetermined bit offset within the candidate message.

13. A transponder for generating and transmitting an electronic tracking signal comprising an electronic tracking message with enhanced detectability, the transponder comprising:
   a memory;
   a processor, the processor configured to:
   generate a binary payload;
   encode the binary payload using at least one error protection scheme; and
   encapsulate the binary payload in a message wrapper to produce the electronic tracking message.

14. The transponder of claim 13, wherein the error protection encoding is selected from one or more of the group consisting of block coding the binary payload, convolutional coding the binary payload and interleaving the binary payload.

15. The transponder of claim 13, wherein the at least one error protection scheme is selected from one or more of the group consisting of Low Density Parity Check coding, Turbo coding, Bose-Chaudhuri-Hocquenghem coding, and Reed-Solomon coding.

16. The transponder of claim 13, wherein the error protection encoding comprises joint coding and modulation.

17. A receiver for recovering message data from an electronic tracking signal, wherein the electronic tracking signal comprises an electronic tracking message with enhanced detectability, the receiver comprising:
   a memory;
   a processor, the processor configured to:
   receive input signal data, the input signal data having been produced by demodulating and decoding the electronic tracking signal;
   identify a candidate message in the input signal data;
   extract a binary payload from the candidate message, the binary payload comprising at least one error protection encoding; and
   decode the at least one error protection encoding of the binary payload to recover the message data.

18. The receiver of claim 17, wherein the at least one error protection comprises interleaving, and wherein the decoding comprises de-interleaving the binary payload.

19. The receiver of claim 17, wherein the at least one error protection comprises convolutional coding, and wherein the decoding comprises Viterbi decoding.

20. The receiver of claim 17, wherein the at least one error protection comprises block coding, and wherein the decoding comprises block decoding.

21. The receiver of claim 17, wherein the at least one error protection is selected from one or more of the group consisting of Low Density Parity Check coding, Turbo coding, Bose-Chaudhuri-Hocquenghem coding, and Reed-Solomon coding.

22. The receiver of claim 17, wherein the candidate message is identified by correlating at least a portion of the candidate message to a predetermined sequence.

23. An electronic tracking system comprising:
   a transponder for generating and transmitting an electronic tracking signal comprising an electronic tracking message with enhanced detectability, the transponder comprising a memory and a processor, the processor configured to:
   receive message data to be transmitted;
   generate a binary payload based on the message data;
   encode the binary payload using at least one error protection scheme; and
   encapsulate the binary payload in a message wrapper of the electronic tracking message; and
   a receiver for recovering the message data from the electronic tracking signal, the receiver comprising a second memory and a second processor, the second processor configured to:
   identify a candidate message in input signal data, the input signal data having been produced by demodulating and decoding the electronic tracking signal;

extract the binary payload from the candidate message, the binary payload having the at least one error protection scheme; and decode the at least one error protection encoding scheme of the binary payload to recover the message data.

\* \* \* \* \*

UNITED STATES PATENT AND TRADEMARK OFFICE
CERTIFICATE OF CORRECTION

PATENT NO. : 9,762,265 B2
APPLICATION NO. : 14/802373
DATED : September 12, 2017
INVENTOR(S) : Baljinder S. Randhawa et al.

Page 1 of 1

It is certified that error appears in the above-identified patent and that said Letters Patent is hereby corrected as shown below:

On the Title Page

Under item (72) "Inventors", the inventor's name reading "Arunas G. Maciknuas" should read
--Arunas G. Macikunas--.

Signed and Sealed this
Eleventh Day of September, 2018

Andrei Iancu
*Director of the United States Patent and Trademark Office*